United States Patent
Tsuchiya et al.

(10) Patent No.: US 11,280,838 B2
(45) Date of Patent: Mar. 22, 2022

(54) INTEGRATED CIRCUIT AND BATTERY MONITORING DEVICE

(71) Applicant: KEIHIN CORPORATION, Tokyo (JP)

(72) Inventors: Shingo Tsuchiya, Utsunomiya (JP); Seiji Kamata, Utsunomiya (JP)

(73) Assignee: HITACHI ASTEMO, LTD., Hitachinaka (JP)

( * ) Notice: Subject to any disclaimer, the term of this patent is extended or adjusted under 35 U.S.C. 154(b) by 196 days.

(21) Appl. No.: 16/595,685

(22) Filed: Oct. 8, 2019

(65) Prior Publication Data

US 2020/0124674 A1 Apr. 23, 2020

(30) Foreign Application Priority Data

Oct. 22, 2018 (JP) .............................. JP2018-198318

(51) Int. Cl.
 *G01R 31/396* (2019.01)
 *H02J 7/00* (2006.01)
 *G01R 31/36* (2020.01)
 *G01R 31/382* (2019.01)

(52) U.S. Cl.
 CPC ....... *G01R 31/3644* (2013.01); *G01R 31/382* (2019.01); *H02J 7/0021* (2013.01)

(58) Field of Classification Search
 None
 See application file for complete search history.

(56) References Cited

U.S. PATENT DOCUMENTS

| | | | | |
|---|---|---|---|---|
| 8,305,043 | B2* | 11/2012 | Yamamoto | G01R 19/0084 320/150 |
| 9,128,164 | B2* | 9/2015 | Mizoguchi | G01R 31/396 |
| 2010/0244847 | A1* | 9/2010 | Kudo | B60L 58/12 324/433 |
| 2012/0323511 | A1* | 12/2012 | Saigo | H01M 10/486 702/63 |
| 2014/0176149 | A1* | 6/2014 | Mizoguchi | G01R 31/396 324/434 |
| 2019/0353713 | A1* | 11/2019 | Fifield | G01R 31/367 |
| 2021/0028637 | A1* | 1/2021 | Kitagawa | G01R 31/389 |

FOREIGN PATENT DOCUMENTS

JP 2014082152 A 5/2014

* cited by examiner

*Primary Examiner* — Jermele M Hollington
(74) *Attorney, Agent, or Firm* — Cantor Colburn LLP

(57) ABSTRACT

An integrated circuit includes a power supply terminal, a ground terminal, a plurality of first input terminals connected to a battery cell, a signal processing circuit having a plurality of second input terminals, and a switch unit, wherein the first input terminals and the second input terminals correspond to each other one-to-one, the switch unit electrically connects arbitrary second input terminals of the plurality of second input terminals to non-correspondence terminals, which are terminals that do not correspond to the arbitrary second input terminals, and the non-correspondence terminals are the second input terminals other than the arbitrary second input terminals, the first input terminals that do not correspond to any of the group consisting of the arbitrary second input terminals, the ground terminal, and the power supply terminal.

5 Claims, 4 Drawing Sheets

INTEGRATED CIRCUIT AND BATTERY MONITORING DEVICE

CROSS REFERENCE TO RELATED APPLICATION

The present invention claims priority under 35 U.S.C. § 119 to Japanese Patent Application No. 2018-198318, filed on Oct. 22, 2018, the entire content of which is incorporated herein by reference.

BACKGROUND OF THE INVENTION

Field of the Invention

The present invention relates to an integrated circuit and a battery monitoring device.

Description of Related Art

Patent Document 1 discloses a battery monitoring IC electrically connected to a plurality of battery cells and configured to monitor states of the battery cells. The battery monitoring IC is an integrated circuit.

IC makers sell a battery monitoring IC to which fourteen battery cells can be connected and a battery monitoring IC to which eighteen battery cells can be connected.

For this reason, when states of twelve battery cells are monitored by one battery monitoring IC, using a battery monitoring IC that can be connected to fourteen battery cells sold by an IC maker as the one battery monitoring IC can be considered. In this case, two idle terminals are generated. In general, an idle terminal is connected to a power supply or a ground via a resistor.

PATENT DOCUMENTS

[Patent Document 1] Japanese Unexamined Patent Application, First Publication No. 2014-82152

SUMMARY OF THE INVENTION

However, when an idle terminal is generated, since there is a need to provide an element or a wiring pattern connected to an idle terminal on a substrate, manufacturing costs may be increased.

In consideration of the above-mentioned circumstances, an object of the present invention is directed to providing an integrated circuit and a battery monitoring device that are capable of minimizing an increase in manufacturing costs.

(1) An aspect of the present invention is an integrated circuit including a power supply terminal; a ground terminal; a plurality of first input terminals connected to a battery cell; a signal processing circuit having a plurality of second input terminals; and a switch unit, wherein the first input terminals and the second input terminals correspond to each other one-to-one, the switch unit electrically connects arbitrary second input terminals of the plurality of second input terminals to non-correspondence terminals, which are terminals that do not correspond to the arbitrary second input terminals, and the non-correspondence terminals are the second input terminals other than the arbitrary second input terminals, the first input terminals that do not correspond to any of the group consisting of the arbitrary second input terminals, the ground terminal, and the power supply terminal.

(2) In the integrated circuit of the above-mentioned (1), the switch unit may be switchable to any one connection state of a first connection state in which arbitrary second input terminals and the first input terminals corresponding to the arbitrary second input terminals are electrically connected, and a second connection state in which the arbitrary second input terminals and the non-correspondence terminals are electrically connected.

(3) In the integrated circuit of the above-mentioned (1) or (2), the non-correspondence terminal may be the ground terminal, and a resistor element may be provided between the switch unit and the ground terminal.

(4) In the integrated circuit of the above-mentioned (1) or (2), the non-correspondence terminal may be the first input terminal that does not correspond to the arbitrary second input terminal, and the first input terminal to which the battery cell is connected.

(5) The integrated circuit according to any one of the above-mentioned (1) to (4) may include a memory in which information of an unused terminal that is the first input terminal to which the battery cell is not connected is stored; and a switch control unit configured to control switching of the switch unit, wherein the switch control unit is configured to switch the switch unit and thereby connect the second input terminal corresponding to the unused terminal to the non-correspondence terminal on the basis of the information of the unused terminal stored in the memory.

(6) An aspect of the present invention is a battery monitoring device comprising the integrated circuit according to any one of the above-mentioned (1) to (4); and a CPU in communication with the integrated circuit, wherein the integrated circuit comprises a switch control unit configured to control switching of the switch unit, and the switch control unit is configured to receive information of an unused terminal that is the first input terminal to which the battery cell is not connected through communication with the CPU, and switch the switch unit and thereby connect the second input terminal corresponding to the unused terminal to the non-correspondence terminal on the basis of the received information of the unused terminal.

As described above, according to the present invention, an increase in manufacturing costs can be minimized.

DETAILED DESCRIPTION OF THE INVENTION

Hereinafter, an integrated circuit and a battery monitoring device according to an embodiment of the present invention will be described with reference to the accompanying drawings.

Figure 1:
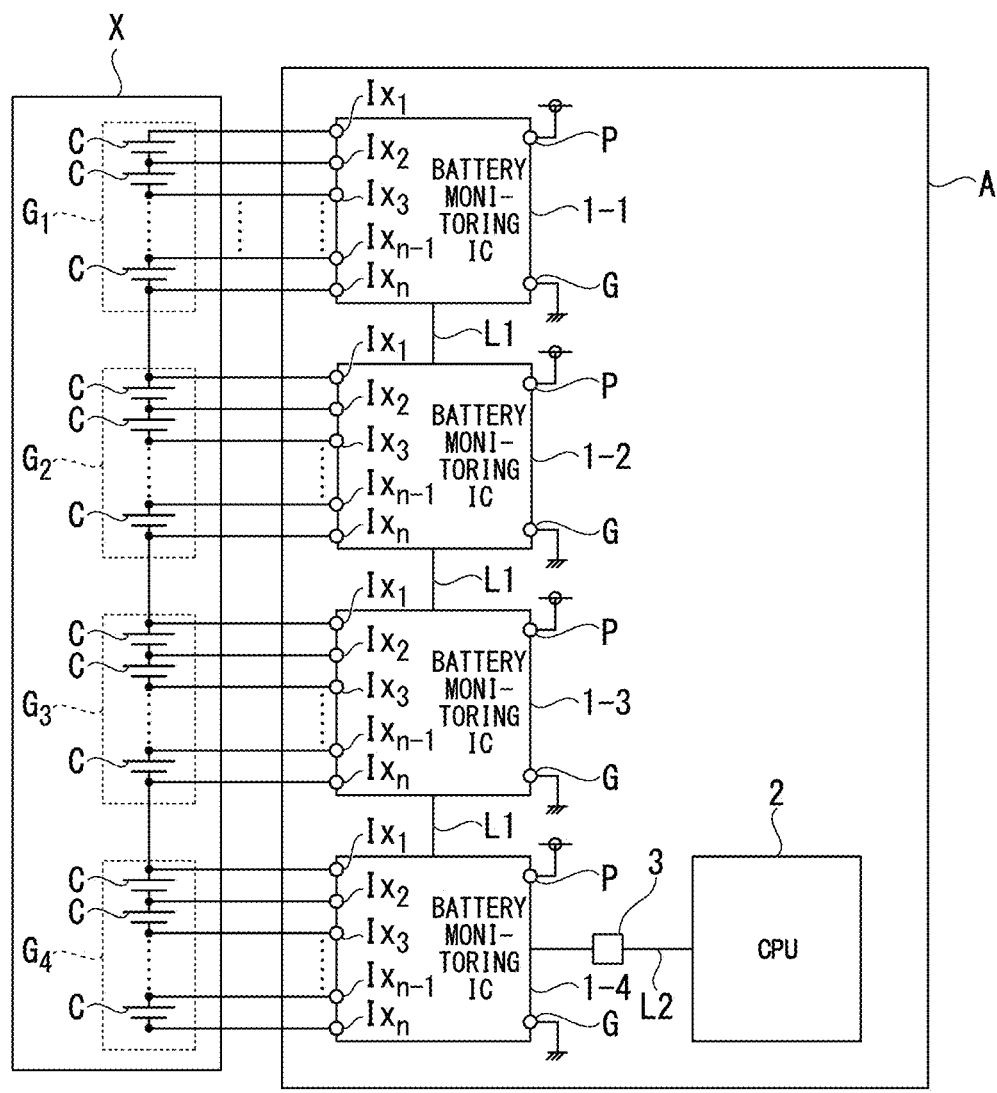
FIG. 1 is a view showing an example of a schematic configuration of a battery monitoring device A including an integrated circuit according to an embodiment of the present invention.

FIG. 1 is a view showing an example of a schematic configuration of a battery monitoring device A including an integrated circuit according to an embodiment of the present invention.

As shown in FIG. 1, the battery monitoring device A according to the embodiment of the present invention is a device configured to detect a voltage of a battery pack X (a direct current power supply) and monitor the voltage.

The battery pack X is a battery mounted in a vehicle such as an electric automobile, a hybrid automobile, or the like. The battery pack X is a secondary battery such as a lithium ion battery, a nickel hydrogen battery, or the like.

The battery pack X includes a plurality of battery cell groups G (G1 to G4) that are connected to each other in series. In each of the battery cell groups G1 to G4, a plurality of battery cells C are connected to each other in series. The number of battery cells C in each of the battery cell groups G1 to G4 (hereinafter referred to as "a battery cell number") depends on a vehicle body size or the like of a vehicle in which the battery pack X is mounted. For this reason, the battery cell number may differ according to the vehicle. Further, in the embodiment, while the case in which the number of battery cell groups G is four will be described, the present invention is not limited to this number of battery cell groups G The battery cell groups G depend on a vehicle body size or the like of the vehicle in which the battery pack X is mounted, and may differ according to the vehicle.

In each of the battery cell groups G1 to G4, a positive electrode terminal of a battery cell disposed on the uppermost side (the uppermost cell) is a positive electrode terminal (an output terminal of one side) of a battery cell group 10, and a negative electrode terminal of a battery cell disposed on the lowermost side (the lowermost cell) is a negative electrode terminal (an output terminal of the other side) of the battery cell group 10. The positive electrode terminal and the negative electrode terminal of each of the battery cell groups G1 to G4 are connected to the battery monitoring device A. Further, when the plurality of battery cell groups G1 to G4 are not distinguished from each other, the battery cell groups G1 to G4 are simply called "the battery cell groups G."

Hereinafter, a configuration of the battery monitoring device A according to the embodiment of the present invention will be described in detail.

As shown in FIG. 1, the battery monitoring device A includes a plurality of battery monitoring ICs 1 (1-1 to 1-4), a CPU 2, and an insulating section 3.

The plurality of battery monitoring ICs 1 (1-1 to 1-4) are electrically connected to the plurality of battery cells C. The plurality of battery monitoring ICs 1 are integrated circuits (ICs) configured to monitor states of the battery cells C. The battery monitoring ICs 1 are provided to correspond to the battery cell groups G1 to G4. Further, in the embodiment, while the case in which the battery monitoring device A includes the four battery monitoring ICs 1-1 to 1-4 corresponding to the battery cell groups G1 to G4 one-to-one will be described, the present invention is not limited thereto. In the present invention, in the battery monitoring device A, the number of battery monitoring ICs 1 is not particularly limited and may be one or more. Further, the plurality of battery monitoring ICs 1-1 to 1-4 have the same configuration, and when the plurality of battery monitoring ICs 1-1 to 1-4 are not distinguished from each other, they are simply called "the battery monitoring ICs 1."

For example, the battery monitoring ICs 1 are provided to correspond to the battery cell groups G one-to-one. The battery monitoring ICs 1 include a plurality of first input terminals Ix1 to Ixn (n is an integer of 2 or more) connected to output terminals of the battery cells C in the battery cell groups G. The output terminals may be positive terminals or negative terminals. The output terminals of the battery cells C and the plurality of first input terminals Ix1 to Ixn of the battery monitoring ICs 1 are connected to each other one-to-one using, for example, connecting wires. Accordingly, both ends of the battery cells C are electrically connected to the battery monitoring ICs 1. Then, the battery monitoring ICs 1 monitor states of the battery cells C by detecting potential differences between both ends of the battery cells C (hereinafter referred to as "both end voltages").

The battery monitoring IC 1 includes a power supply terminal P configured to supply electric power to the battery monitoring IC 1. A power supply provided at the outside is connected to the power supply terminal P. For example, the battery monitoring IC may receive power from the battery cells C to be operated by connecting the power supply terminal P to the battery cells C that are monitoring objects.

Further, the battery monitoring IC includes a ground (GND) terminal G The ground terminal G is connected to a grounding terminal (a ground potential).

Further, in the embodiment, the plurality of battery monitoring ICs 1-1 to 1-4 are connected to each other by communication lines L1 in a daisy-chain manner. Each of the communication lines L1 is a communication line that is capable of bidirectional communication. Each of the battery monitoring ICs 1 is capable of bidirectional communication with the neighboring battery monitoring ICs 1.

In addition, only the battery monitoring IC 1-4 of the plurality of battery monitoring ICs 1-1 to 1-4 that are connected in a daisy-chain manner is connected to communicate with the CPU 2 via a communication line L2. The communication line L2 is a communication line capable of bidirectional communication, and has the insulating section 3. Accordingly, the battery monitoring IC 1-4 and the CPU 2 transmit and receive information by communicating with each other while being electrically insulated from each other.

The CPU 2 acquires both end voltages of the battery cells C detected by the battery monitoring ICs 1-1 to 1-4 from the battery monitoring IC 1-4. The CPU 2 monitors a voltage of the battery pack X (the direct current power supply) by monitoring the acquired both end voltages of the battery cells C.

The insulating section 3 is, for example, a photo-coupler, a magnetic coupler, or the like, which is configured to insulate electrical connection between the battery monitoring IC 1-4 and the CPU 2.

Figure 2:
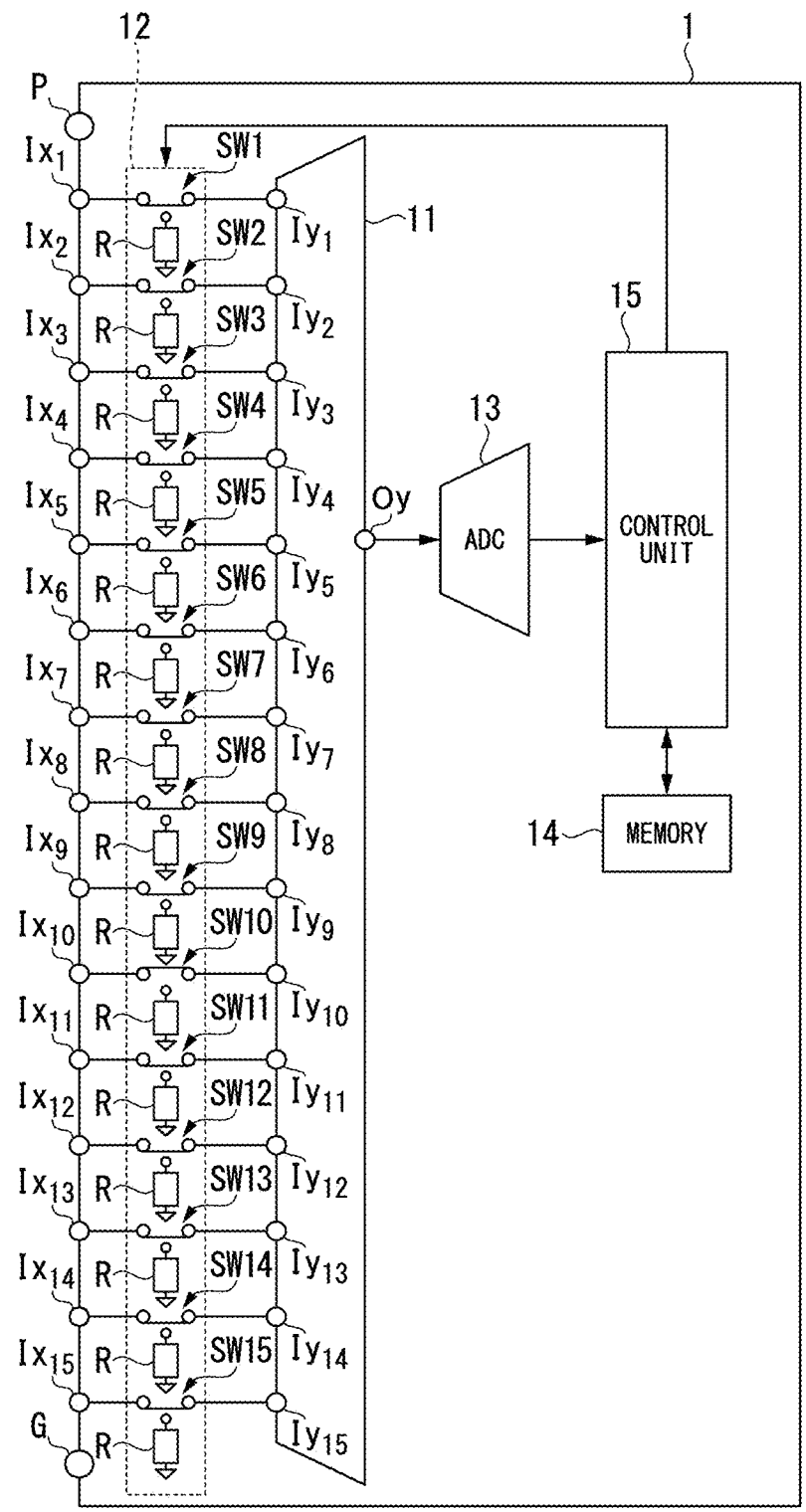
FIG. 2 is a view showing an example of a schematic configuration of a battery monitoring IC 1 according to the embodiment of the present invention.

Next, a schematic configuration of the battery monitoring IC 1 according to the embodiment will be described in detail with reference to FIG. 2. FIG. 2 is a view showing an example of a schematic configuration of the battery monitoring IC 1 according to the embodiment. Further, in the example shown in FIG. 2, n=15.

The battery monitoring IC 1 includes the plurality of first input terminals Ix1 to Ixn, the power supply terminal P, the ground terminal G, a multiplexer 11, a switch unit 12, an analog-digital converter (ADC) 13, a memory 14, and a control unit 15. Further, the multiplexer 11 is an example of "a signal processing circuit" of the present invention. The analog-digital converter (ADC) 13 may be an example of "the signal processing circuit." In addition, the switch control unit is an example of "a control unit" of the present invention.

The multiplexer 11 includes a plurality of second input terminals Iy1 to Iyn and an output terminal Oy. The multiplexer 11 acquires a selected signal from the outside. The multiplexer selects any one of input signals input to the plurality of second input terminals Iy1 to Iyn on the basis of the selected signal. Then, the multiplexer 11 outputs the selected input signal as an output signal Sa from the output terminal Oy.

The second input terminals Iy1 to Iyn are provided to correspond to the first input terminals Ix1 to Ixn one-to-one. The second input terminals Iy1 to Iyn and the first input terminals Ix1 to Ixn have a one-to-one correspondence. For example, the second input terminal Iy1 and the first input terminal Ix1 have a one-to-one correspondence. For example, the second input terminal Iy2 and the first input terminal Ix2 have a one-to-one correspondence. For example, the second input terminal Iyn and the first input terminal Ixn have a one-to-one correspondence.

The switch unit 12 electrically connects arbitrary second input terminals Iy of the second input terminals Iy1 to Iyn to non-correspondence terminals, which are terminals that do not correspond to the arbitrary second input terminals Iy one-to-one. The non-correspondence terminals are the second input terminals Iy other than the arbitrary second input terminals Iy, the first input terminals Ix that do not correspond to the arbitrary second input terminals Iy one-to-one, the ground terminal G, or the power supply terminal P.

For example, when the second input terminal Iy1 of the second input terminals Iy1 to Iyn is electrically connected to the non-correspondence terminal, the non-correspondence terminals are one or more terminals of the second input terminals Iy2 to Iyn, the first input terminals Ix2 to Ixn, the ground terminal G, and the power supply terminal P. Further, when described below, the non-correspondence terminal will be described as the ground terminal G.

Hereinafter, a configuration of the switch unit 12 will be described.

The switch unit 12 includes a plurality of switches SW1 to SWn and a plurality of resistor elements R. Further, when the plurality of switches SW1 to SWn are not distinguished from each other, they are simply called "the switches SW."

In the embodiment, the switches SW are each provided between the first input terminals Ix1 to Ixn and the second input terminals Iy1 to Iyn. That is, the switches SW are each provided between the first input terminals Ix1 to Ixn and the second input terminals Iy1 to Iyn, which correspond to each other one-to one.

The switches SW can be switched to any one connection state of a first connection state in which the second input terminals Iy and the first input terminals Ix that correspond to each other one-to-one are electrically connected, and a second connection state in which the second input terminals Iy and the ground terminal G are electrically connected. The switch SWk can be switched to any one connection state of a first connection state in which the second input terminals Iyk and the first input terminals Ixk are electrically connected, and a second connection state in which the second input terminals Iyk and the ground terminal G are electrically connected. Here, k is an integer of any one of 1 to n.

The resistor elements R are provided between the switches SW and the ground terminal G. For example, first end portions of the resistor elements R are electrically connected to the ground terminal G. In the second connection state according to the embodiment, the second input terminals Iyk are electrically connected to second end portions of the resistor elements R. The second connection state is a state in which the second input terminals Iyk are electrically connected to the ground terminal G via the resistor elements R.

The ADC 13 converts the output signal Sa of analog data output from the output terminal Oy of the multiplexer 11 into digital data. Then, the ADC 13 transmits an output signal Sd of digital data to the control unit 15.

Information on an unused terminal (hereinafter referred to as "unused terminal information") that is a first input terminal Ix to which the battery cells C are not connected in the first input terminals Ix1 to Ixn is previously stored in the memory 14. For example, the unused terminal information is previously stored in the memory 14 during manufacturing of the battery monitoring device A, program writing on the battery monitoring device A, or the like.

The control unit 15 has a communication function capable of bidirectional communication with the other battery monitoring IC 1 or the CPU 2. The control unit 15 transmits the output signal Sd to the other battery monitoring IC 1 or the CPU 2.

The control unit 15 controls an operation of the switch unit 12. For example, the control unit 15 controls switching of the switch unit 12. The control unit 15 specifies an unused terminal on the basis of the unused terminal information stored in the memory 14. The control unit 15 controls the switch unit 12 and thereby connect the second input terminals Iy corresponding to the unused terminals one-to-one to the non-correspondence terminals. The control unit 15 switches the switches SW to the first connection state or the second connection state by controlling switching of the switches SW on the basis of the unused terminal information.

Hereinafter, switching operations of the switches SW of the battery monitoring IC 1 according to the embodiment will be described with reference to FIG. 3.

For example, while the fourteen battery cells C can be connected to the battery monitoring IC 1, the twelve battery cells C are connected to the battery monitoring IC 1. In the example shown in FIG. 3, in the first input terminals Ix1 to Ix15 (n=15) of the battery monitoring IC 1, the battery cells C are not connected to the first input terminal Ix5 and the first input terminal Ix6 only. Accordingly, information of identifying the first input terminals Ix5 and the first input terminals Ix6 is previously stored as unused terminal information in the memory 14.

In this case, the control unit 15 reads the unused terminal information from the memory 14. The control unit 15 controls the switch unit 12 and thereby connect the first input terminal Ix5 and the first input terminal Ix6 to the non-correspondence terminals on the basis of the unused terminal information read from the memory 14.

For example, a table T that can determine the switches SW to be in the second connection state on the basis of the unused terminal information may be stored in the memory 14. The table T includes information of the input terminals Ix1 to Ix15, and information of the switches SW1 to SW15 corresponding to the input terminals Ix1 to Ix15. The control unit 15 acquires information of the switches SW corresponding to the input terminals Ix indicated the unused terminal information from the table T. Then, the control unit 15 controls the unused terminals to be in the second connection state by controlling the switches SW indicated by the information acquired from the table T.

Figure 3:
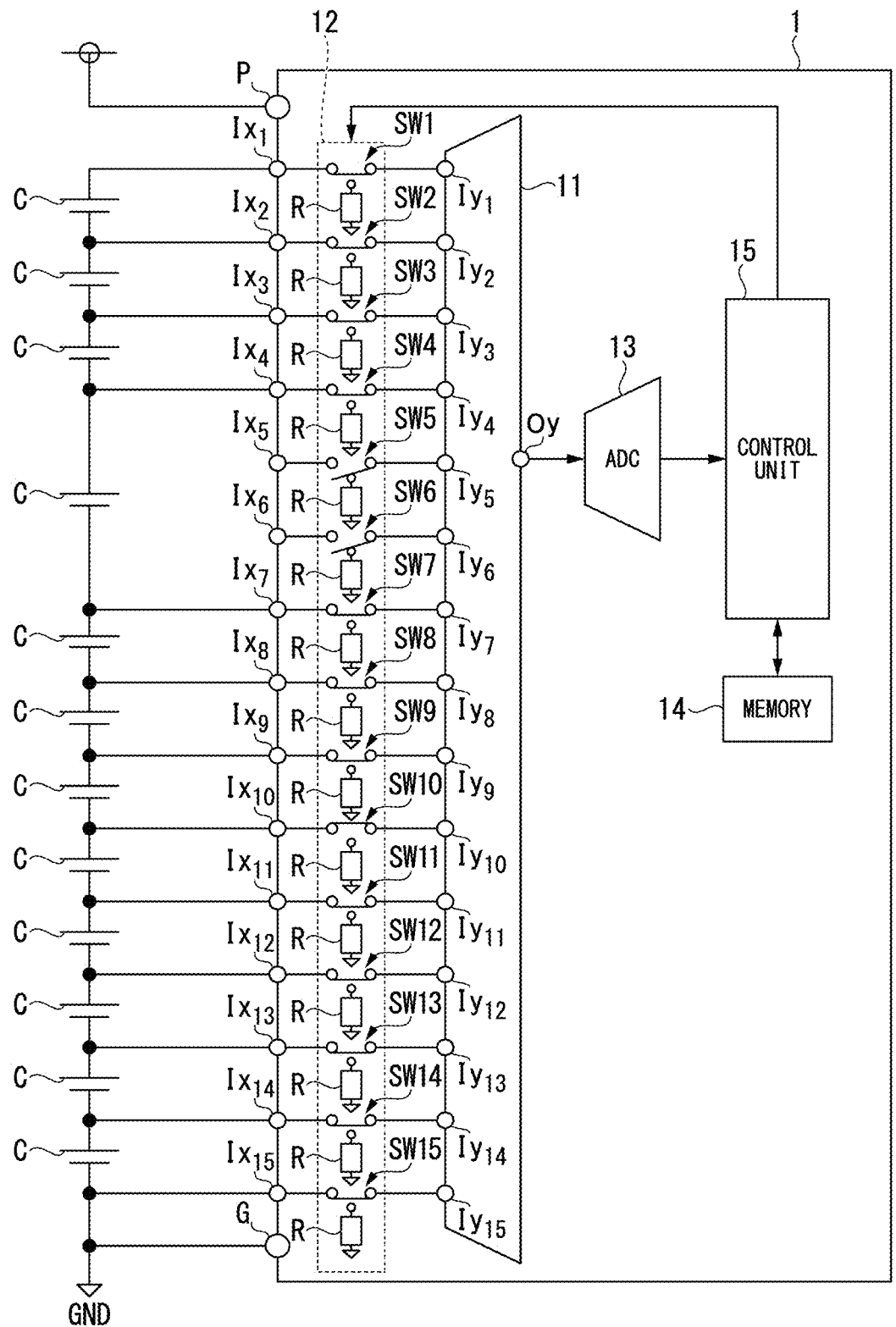
FIG. 3 is a view for describing a switching operation of a switch SW of the battery monitoring IC 1 according to the embodiment of the present invention.

In the example shown in FIG. 3, the control unit 15 controls only the switch SW5 and the switch SW6 among the switch SW1 to the switch SW15 to be in the second connection state. Accordingly, the control unit 15 electrically connects the second input terminals Iy5 and Iy6 that are idle terminals to the ground terminal G via the resistor elements R. In other words, the control unit 15 controls the switch SW5 and the switch SW6 and connects only the second input terminals Iy5 and Iy6 that are idle terminals to the ground terminal. Accordingly, the control unit 15 can perform idle pin processing with respect to the second input terminals Iy5 and Iy6. In the battery monitoring IC 1, an element or a wiring pattern connected to the idle terminal need not be provided on the substrate even when the idle terminal is generated. Accordingly, the battery monitoring IC 1 can minimize an increase in manufacturing costs.

Further, timing when the control unit 15 reads the unused terminal information from the memory 14 can be arbitrarily set. For example, the control unit 15 may read the unused terminal information from the memory 14 when the power is supplied and the control unit 15 is started. In addition, the control unit 15 may read the unused terminal information from the memory 14 when a signal indicating that the switch unit 12 is controlled is acquired from the CPU 2. In addition, the control unit 15 may read the unused terminal information from the memory 14 according to a fact that a starting signal of the CPU 2 starting the battery monitoring IC 1 is output to the battery monitoring IC 1. For example, the control unit 15 may read the unused terminal information from the memory 14 when the starting signal is acquired from the CPU 2.

While an embodiment of the present invention has been described above in detail with reference to the accompanying drawings, a specific configuration is not limited to the embodiment and may include designs or the like without departing from the spirit of the present invention.

(Variant 1)

For example, while the case in which the non-correspondence terminal is the ground terminal G has been described in the embodiment, the present invention is not limited thereto. For example, the non-correspondence terminal may be any one of the second input terminals Iy2 to Iyn, may be any one of the first input terminals Ix2 to Ixn that do not correspond to the arbitrary second input terminal Iy1 one-to-one, or may be the power supply terminal P.

Figure 4:
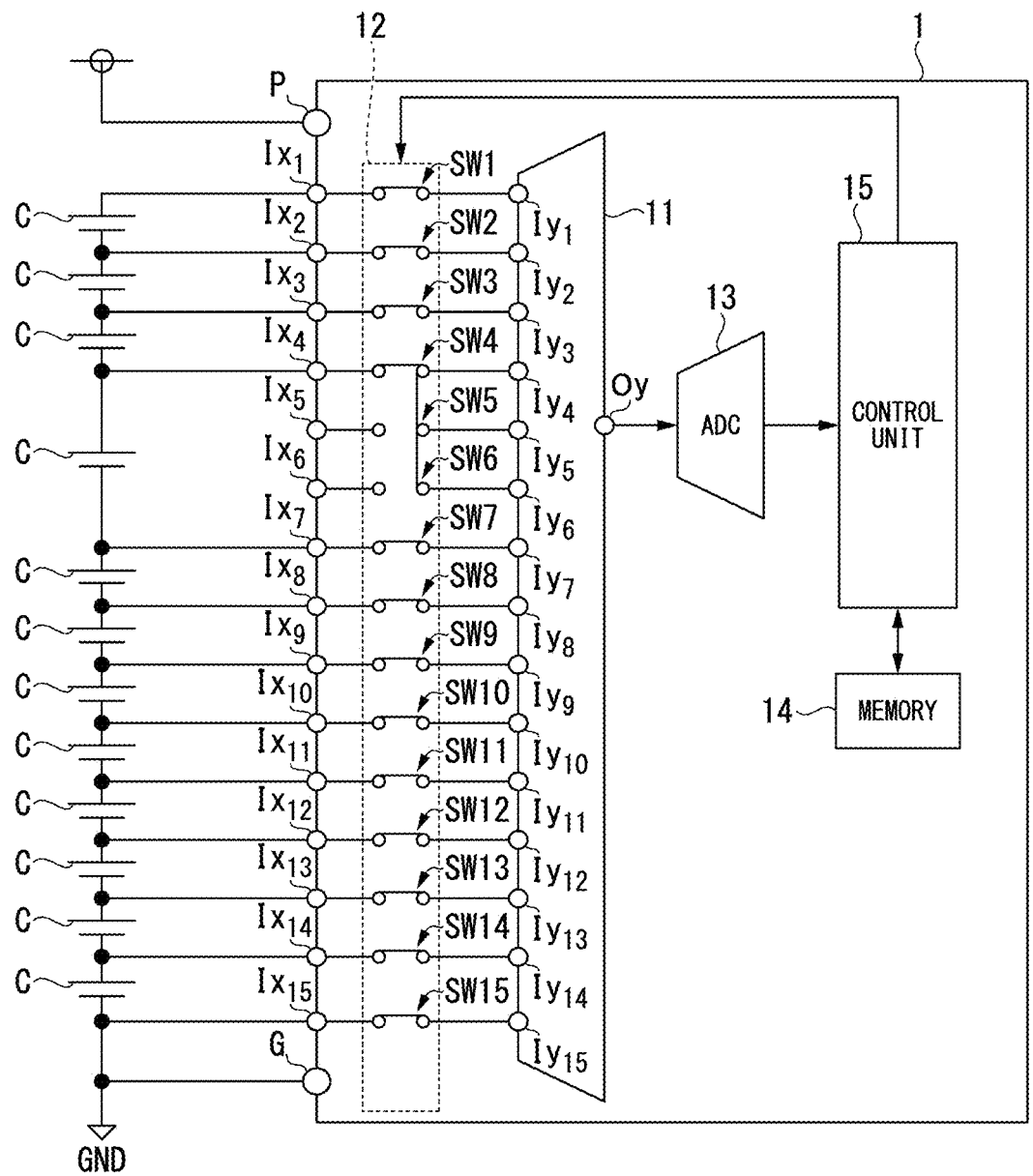
FIG. 4 is a view for describing a switching operation of the switch SW of the battery monitoring IC 1 according to the embodiment of the present invention.

For example, FIG. 4 is a view showing an example when the non-correspondence terminals are the second input terminals Iy other than the arbitrary second input terminals Iy. In the example shown in FIG. 4, the switch SWk can be switched to any one connection state of a first connection state in which the second input terminals Iyk are electrically connected to the first input terminals Ixk corresponding thereto one-to-one, and a second connection state in which the second input terminals Iyk and the second input terminals Iym are electrically connected. Here, m is an integer from 1 to n other than k.

Hereinafter, switching operations of the switches SW of the battery monitoring IC 1 shown in FIG. 4 will be described.

For example, similar to FIG. 3, in the battery monitoring device A shown in FIG. 4, while fourteen battery cells C can be connected to the battery monitoring IC 1, the twelve battery cells C are connected to the battery monitoring IC 1. Then, as shown in FIG. 4, the battery cells C are not connected to only the first input terminals Ix5 and the first input terminals Ix6 in the first input terminals Ix1 to Ix15 (n=15) of the battery monitoring IC 1. Accordingly, information that identifies the first input terminals Ix5 and the first input terminals Ix6 is previously stored as the unused terminal information in the memory 14.

In this case, the control unit 15 reads the unused terminal information from the memory 14. The control unit 15 controls the switch unit 12 and thereby connect the first input terminals Ix5 and the first input terminals Ix6 to the non-correspondence terminals on the basis of the unused terminal information read from the memory 14. For example, the control unit 15 acquires information of the input terminals Ix indicated by the unused terminal information stored in the memory 14, and acquires the switch SW corresponding to the input terminals Ix from the table T. Then, the control unit 15 controls the switches SW acquired from the table T to control the unused terminal to be in the second connection state.

In the example shown in FIG. 4, the control unit 15 electrically connects the second input terminal Iy5 to the second input terminal Iy4 adjacent thereto, and electrically connects the second input terminal Iy6 to the second input terminal Iy5 adjacent thereto by controlling only the switch SW5 and the switch SW6 to be in the second connection state. Accordingly, the second input terminal Iy5 and the second input terminal Iy6 are electrically to the second input terminal Iy4. The second input terminal Iy4 is electrically connected to the first input terminal Ix4 to which the battery cell C is connected. For this reason, when the second input terminal Iy5 and the second input terminal Iy6 that are idle terminals are connected to the second input terminal Iy4, a potential is stabilized.

Further, in the example shown in FIG. 4, the second input terminal Iy5 and the second input terminal Iy6 that are idle terminals are electrically connected to the first input terminal Ix4 to which the battery cell C is connected. Accordingly, the non-correspondence terminals in FIG. 4 are the first input terminals Ix that do not correspond to the second input terminal Iy5 or the second input terminal Iy6 one-to-one. Here, "the first input terminals Ix that do not correspond to the second input terminal Iy5 or the second input terminal Iy6 one-to-one" are the first input terminals Ix to which the battery cells C are connected.

(Variant 2)

While the battery monitoring IC 1 of the embodiment acquires the unused terminal information from the memory 14, the present invention is not limited thereto. The battery monitoring IC 1 may acquire the unused terminal information from the outside. For example, the battery monitoring IC 1 may acquire the unused terminal information from the CPU 2 through communication with the CPU 2. When the battery monitoring device A has the four battery monitoring ICs 1-1 to 1-4 that are connected in a daisy-chain manner, the battery monitoring IC 1-4 communicates with the CPU 2 via the communication line L2 and receives the unused terminal information. Then, the battery monitoring IC 1-4 transmits the unused terminal information to the battery monitoring IC 1-3 on a rear stage while storing the unused terminal information in the memory 14 of the battery monitoring IC 1-4. The battery monitoring IC 1-3 transmits the unused terminal information to the battery monitoring IC 1-2 on a rear stage while receiving the unused terminal information from the battery monitoring IC 1-4 and storing the unused terminal information in the memory 14 of the battery monitoring IC 1-3. As a result, the unused terminal information is transmitted to the battery monitoring IC 1-1, and the battery monitoring ICs 1-1 to 1-4 can acquire the unused terminal information by receiving the unused terminal information.

Hereinabove, as described, the battery monitoring IC 1 according to the embodiment includes the power supply terminal P, the ground terminal G, the plurality of first input terminals Ix connected to the battery cells C, the multiplexer 11 having the plurality of second input terminals Iy, and the switch unit 12. The first input terminals Ix and the second input terminals Iy correspond to each other one-to-one. The switch unit 12 electrically connects the arbitrary second input terminals Iy to the non-correspondence terminals, which are terminals that do not correspond to the second input terminals Iy one-to-one. The non-correspondence terminals are the second input terminals Iy other than the arbitrary second input terminals Iy, the first input terminals Ix that do not correspond to the arbitrary second input terminal one-to-one, the ground terminal G, or the power supply terminal P.

According to the above-mentioned configuration, the battery monitoring IC 1 does not require an element or a wiring pattern connected to the idle terminal on the substrate in performing idle terminal processing. Accordingly, an increase in manufacturing costs can be minimized.

According to the integrated circuit and the battery monitoring device, an increase in manufacturing costs can be minimized.

While preferred embodiments of the invention have been described and shown above, it should be understood that these are exemplary examples of the invention and are not to be considered as limiting. Additions, omissions, substitutions, and other modifications can be made without departing from the spirit or scope of the present invention. Accordingly, the invention is not to be considered as being limited by the foregoing description, and is only limited by the scope of the appended claims.

EXPLANATION OF REFERENCES

A Battery monitoring device
1 Battery monitoring IC
2 CPU
Ix First input terminal
P Power supply terminal
G Ground terminal
11 Multiplexer (signal processing circuit)
12 Switch unit
14 Memory
15 Control unit

What is claimed is:

1. An integrated circuit comprising:
    a power supply terminal configured to supply electrical power to the integrated circuit;
    a ground terminal electrically connected to a ground potential;
    a plurality of first input terminals electrically connected to a battery cell;
    a signal processing circuit having a plurality of second input terminals; and
    a plurality of switches respectively and electrically connected between the plurality of first input terminals and the signal processing circuit,
    wherein the first input terminals and the second input terminals correspond to each other one-to-one,
    wherein a switch of the plurality of switches is configured to be switched between:
        a first connection state in which single second input terminal is electrically connected to a first input terminal in one-to-one correspondence with the single second input terminal; and
        a second connection state in which the single second input terminal is not electrically connected to the first input terminal in one-to-one correspondence with the single second input terminal, and
    wherein the second connection state is a state in which the single second input terminal is electrically connected to the second input terminal other than the single second input terminals, the first input terminal that is not in one-to-one correspondence with the single second input terminal, the ground terminal, or the power supply terminal.

2. The integrated circuit according to claim 1, wherein the second connection state is a state in which the single second input terminal is electrically connected to the ground terminal via a resistor element.

3. The integrated circuit according to claim 1, wherein the second connection state is a state in which the single second input terminal is electrically connected to the first input terminal that is not in one-to-one correspondence with the single second input terminal, and the first input terminal to which the battery cell is connected.

4. The integrated circuit according to claim 1, comprising:
    a memory in which information of an unused terminal that is the first input terminal to which the battery cell is not connected is stored; and
    a switch control unit configured to control switching of the switch,
    wherein the switch control unit is configured to switch the switch and thereby controls the second input terminal in one-to-one correspondence with the unused terminal to the second connected state on the basis of the information of the unused terminal stored in the memory.

5. A battery monitoring device comprising:
    the integrated circuit according to claim 1; and
    a CPU in communication with the integrated circuit,
    wherein the integrated circuit comprises a switch control unit configured to control switching of the switch, and
    the switch control unit is configured to receive information of an unused terminal that is the first input terminal to which the battery cell is not connected through communication with the CPU, and switch the switch and thereby controls the second input terminal in one-to-one correspondence with the unused terminal to the second connected state on the basis of the received information of the unused terminal.

* * * * *